CAM ACTUATED PRINTED CIRCUIT BOARD CONNECTOR

Filed Jan. 21, 1969 3 Sheets-Sheet 1

INVENTORS.
THOMAS W. CONRAD
WILLIAM McIVER
BY
Harry S. Hertz
ATTORNEY

INVENTORS.
THOMAS W. CONRAD
WILLIAM McIVER
BY
Harvey S. Hertz
ATTORNEY

CAM ACTUATED PRINTED CIRCUIT BOARD CONNECTOR

Filed Jan. 21, 1969 3 Sheets-Sheet 3

INVENTORS.
THOMAS W. CONRAD
WILLIAM McIVER
BY Harry S. Hertz
ATTORNEY 3,526,869
CAM ACTUATED PRINTED CIRCUIT BOARD CONNECTOR Thomas W. Conrad, Altadena, Calif., and William McIver, West Monroe, La., assignors to International Telephone and Telegraph Corporation, New York, N.Y., a corporation of Delaware Filed Jan. 21, 1969, Ser. No. 792,585
Int. Cl. H01r 13/54
U.S. Cl. 339—75 6 Claims

ABSTRACT OF THE DISCLOSURE

The disclosure relates to a cam actuated printed circuit board connector. The connector contains an opening therethrough for insertion of a printed circuit board. A cam is provided for driving a housing actuating member in a horizontal direction along its longitudinal axis, forcing actuating spacers up ramp angles in a direction perpendicular to said longitudinal axis. Movement of the spacers drives the connector contacts into intimate contact with the printed circuit board pads. The contact terminals may be alternately offset so as to allow greater working area between adjacent terminals. Moreover, polarizing keys may be provided in the connectors for properly mating the printed circuit board and the connector.

The invention relates in general to cam actuated printed circuit board connectors, and more particularly, to a printed circuit board connector which is activated by movement of an actuating mounting in a horizontal plane.

BACKGROUND OF THE INVENTION

Prior art printed circuit board connectors have been primarily concerned with low insertion force of the printed circuit board into the connector. Typical arrangements are found in U.S. Pat. No. 3,329,926; U.S. patent application No. 627,439, filed Mar. 31, 1967; U.S. patent application No. 628,854, filed Apr. 6, 1967, and U.S. patent application No. 658,258, filed Aug. 3, 1967, all assigned to the assignee of the present patent application. Further, printed circuit board connectors are shown in U.S. Pats. Nos. 2,811,700; 2,857,557; 3,040,291; and 3,188,598; British Pats. Nos. 885,040 and 863,049; and French Pat. No. 1,398,310.

Prior art techniques tend to solve the problem of obtaining a low or zero force insertion of the connector, by numerous techniques which have not proved sophisticated enough for continual repeated use. Further, wear on printed circuit board pads due to excessive wiping action upon full insertion depth of the printed circuit board has been a drawback to some of these types of connectors. Moreover, the mechanics of the arrangements utilized have been unreliable due to their lack of ruggedness. Further, due to space limitations, the configuration and material thickness which is dictated by the spring characteristics required to produce suitable contact pressures and action have proved unsatisfactory. Thus, the conventional printed circuit connector which operates on the principle of displacing opposed rows of leaf-type spring contacts as the printed circuit board is inserted into the space provided between the rows has proved unsatisfactory. Further, certain prior art printed circuit board connectors have contained independent actuation means for connecting the connector contacts to the printed circuit board pads after full insertion of the printed circuit board. However, these actuators have not provided suitable contact pressures and have failed to operate satisfactorily where the printed circuit board must be inserted and removed numerous times. Moreover, these connectors could not be easily miniaturized.

In order to overcome the attendant disadvantages of prior art printed circuit board connectors, the present invention may be utilized with a relatively simple circuit printed board. Moreover, the contact material may be made much thicker and still maintain good spring characteristics. Further, the high insertion and extraction force needed to overcome having the contacts clear the path of the printed circuit board travel is eliminated. During insertion and extraction, there is basically no force applied to the printed circuit board. Moreover, the high millivolt drop in contacts is overcome by the increase in thickness of material giving a larger cross-sectional area thereto, thus reducing the resistance of the contact member while maintaining high contact pressures. The wear on the contact pads on the printed circuit board is completely overcome due to the elimination of the force the spring contact normally exerts against the forward end of the circuit pad when the board is inserted and extracted. Moreover, the connector is rugged and allows numerous insertions and extractions of the printed circuit board. Further, the connector actuation means allows the connector to be miniaturized.

SUMMARY OF THE INVENTION

More particularly, the invention comprises a printed circuit board connector having an opening therethrough for insertion of a printed circuit board. Means such as a cam are provided for driving an actuating member in a horizontal direction along a longitudinal axis, forcing an actuating spacer in a direction perpendicular to said longitudinal axis, thus driving the connector contacts into intimate contact with the printed circuit board pads. Further, the cam can unlock the connector and allow the printed circuit board to be removed. The contact termination pattern may be alternately offset so as to allow greater working area between the connector terminals. Moreover, polarizing means may be provided in the connectors for properly mating the printed circuit board and the connector.

The advantages of this invention, both as to its construction and mode of operation will be readily appreciated as the same become better understood by reference to the following detailed description when considered in connection with the accompanying drawings, in which like referenced numerals designate like parts throughout the figures.

DESCRIPTION OF THE PREFERRED EMBODIMENT

Figure 1:
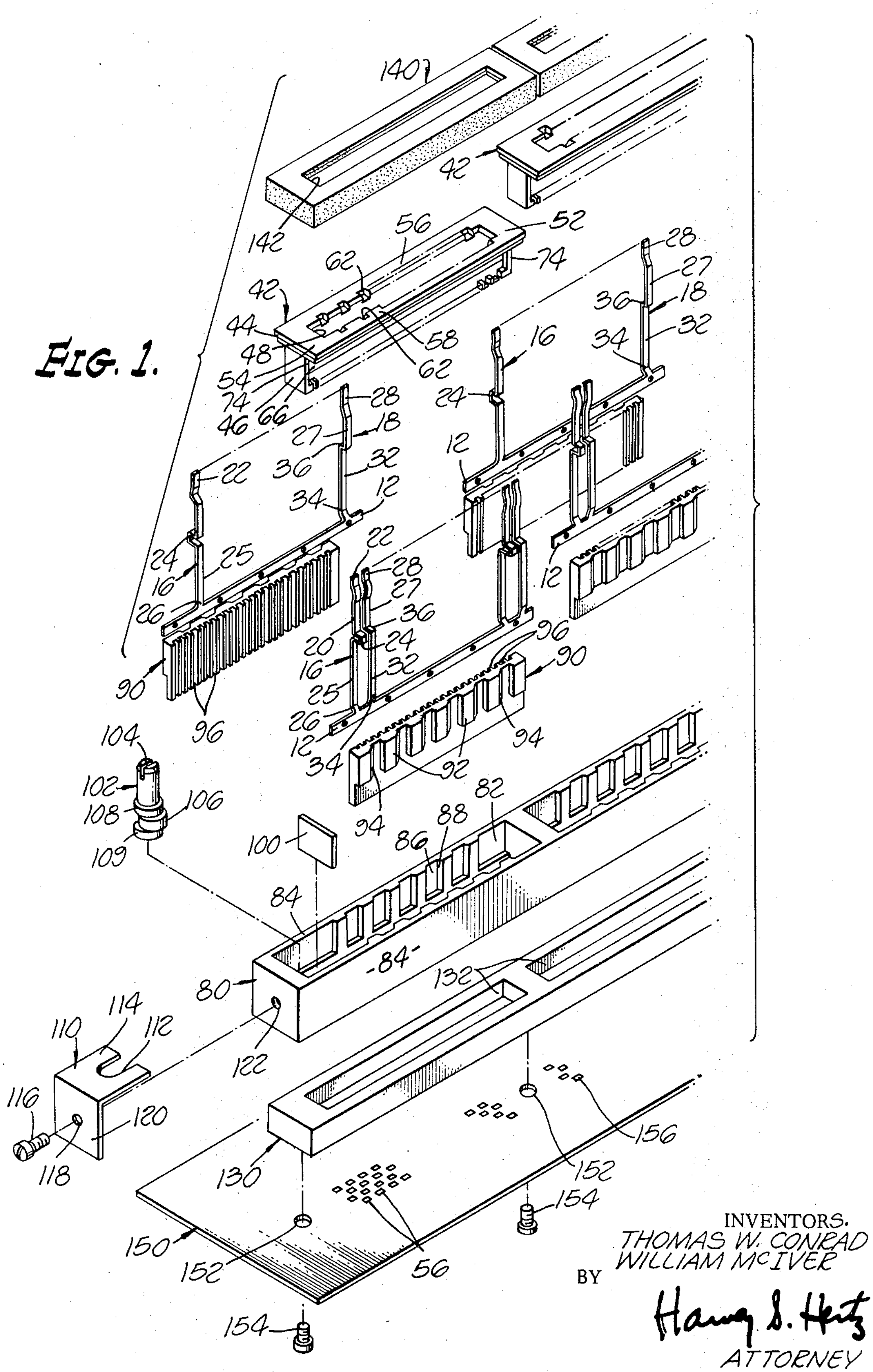
FIG. 1 depicts an exploded perspective view of a preferred embodiment of a printed circuit board connector in accordance with the invention.

Referring now to the drawings, there is shown in FIG. 1 an exploded view of the horizontally actuated printed circuit board connector in accordance with the invention. The actuator comprises a plurality of contacting members which are secured to carrier strips 12 for initial mounting in the connector. The contacts shown in the drawings are formed of a first series of contacts 16 and a second series of contacts 18 alternately spaced on the carrier strip. Each of the contacts 16 contains a top portion 20 having a contacting surface 22 which is connected to one end of a U-shaped central section 24. The other end of the U-shaped section 24 is connected to a lower terminal portion 25 which is generally straight and terminates at a break-off point 26, connected to the carrier strip 12. The contacts 18 are formed of a top portion 27 having a contacting surface 28 at one end thereof and a substantially straight terminal portion 32 at the other end thereof having a break-off point 34 connected to the carrier strip. The top portion 27 and the straight section 32 are interconnected by means of a bracket 36 extending perpendicular to portion 27 and section 32.

The sets of contacts are secured to a contact carrier 42 formed of insulating material. The carrier 42 is formed of a top portion 44 and a bottom portion 46. The top portion 42 is generally rectangular in shape and contains a generally rectangular opening 48 therein. The top portion 44 is formed of end sections 52, 54 and side sections 56, 58. The side sections each have a plurality of opposing slots 62 cut therein into which T-shaped key members 64 may be inserted to form a polarizing key for correctly mating with notches formed in a printed circuit board. As many T-keys 64 may be used as desired in the slots 62 so as to provide the desired polarization code. The bottom section 46 is formed of a central section 66 having a top end 68 and a bottom end 71. Sides 72, 73 of the bottom portion 46 are alternately shaped so as to form the correct mating with the portions 24 and 36 on the contacts, respectively. Thus, the portion 72 of the insulator extends outwardly to mate with the U-shaped slot 24 of the contact 16 and the portion 73 of the insulator mates with the L-shaped section 36 of the contact 18. The top portion 44 and the bottom portion 46 are joined at the ends of the carrier 42 by posts 74 which are perpendicular to the axis of the carrier.

The contacts 16, 18 are secured to the carrier strips 12 so that when they are mounted on the contact carrier, a contact of the type depicted as 16 in the drawings, is opposite the contact depicted as 18. In this manner the terminal portions 25, 32, respectively, are offset from the adjacent contacts so as to allow greater room for making connections to their bottom portions.

After the contacts have been installed on the member 42, the member 42 and contacts are positioned in the actuating housing 80 which is normally made of high load carrying material such as stainless steel. The housing 80 is divided into a plurality of partitions 82 which have opposing side walls 84. The side walls have cut therein slotted portions 86 having a ramp section 88 associated therewith. Installed into each of the partitions of the housing are a pair of actuator spacers 90 made of insulating material which have portions 92 which fit into the slots 86 of the housing and ramp portions 94 which abut the ramp portion 88 of the housing. The inner side of the spacer 90 contains a plurality of slots 96 into which the contacts 16 and 18 fit.

The actuator housing 80 is then slidably mounted between the upper surface of the mounting block 130 at the bottom side of the housing, and lower flange portion of sides 56 and 58 at the upper side of the housing. The mounting block 130 has openings 132 therethrough for allowing the bottom portions of the contacts 16 and 18 to extend therethrough and provide support and alignment for the lower portion of section 46.

The actuating housing 82 further contains a pressure plate 100 which is mounted perpendicular to the axis of the housing and has associated therewith an actuating cam 102. The cam 102 contains a slot 104 for rotating the cam and a bearing surface 106 which is off-set and secured between a pair of surfaces 108, 109. The cam is installed in the housing 82 with the surfaces 108 and 109 normally abutting the pressure plate 100. A cam retainer bracket 110 having a U-shaped opening 112 in its top portion 114 is secured to the actuating housing by means of a bolt 116, which is threaded through an opening 118 in the side portion 120 of the bracket. The bolt 116 secures the bracket 110 to the housing 82 when it is inserted through the opening 118 into a threaded opening 122 in the housing 80 with the slotted portion 104 of the cam extending through the opening 112 in the cam retainer bracket.

Further, the contact carrier 42 is covered with a resilient environmental seal 140 which may be made of elastomer. The seal 140 contains an opening 142 into which the printed circuit board is inserted. The package as thus far described is a complete operational printed circuit board connector. The connector may be mounted on a mounting surface 150. The surface 150 contains holes 152 through which bolts 154 may be inserted for threadably securing the mounting surface to the mounting block 130 of the connector. The mounting surface also contains openings 156 through which the contacts 16, 18 may be inserted.

Figure 2:
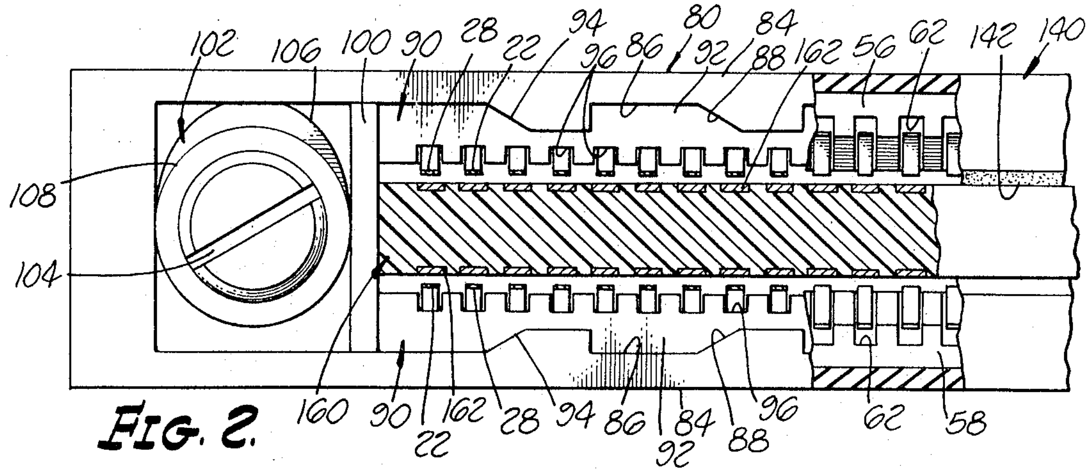
FIG. 2 shows a top view, partly in section, of the printed circuit board connector having a printed circuit board inserted therein prior to the contacts of the connector contacting the pads of the printed circuit board.
Figure 3:
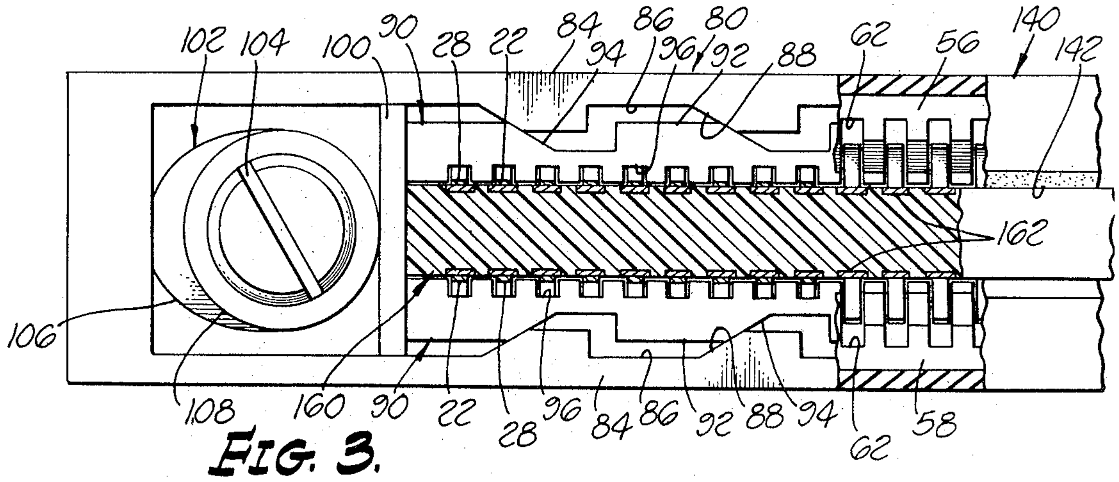
FIG. 3 illustrates a top view, partly in section, of the printed circuit board connector of FIG. 2 with the contacts of the connector in contact with the printed circuit board pads.
Figure 4:
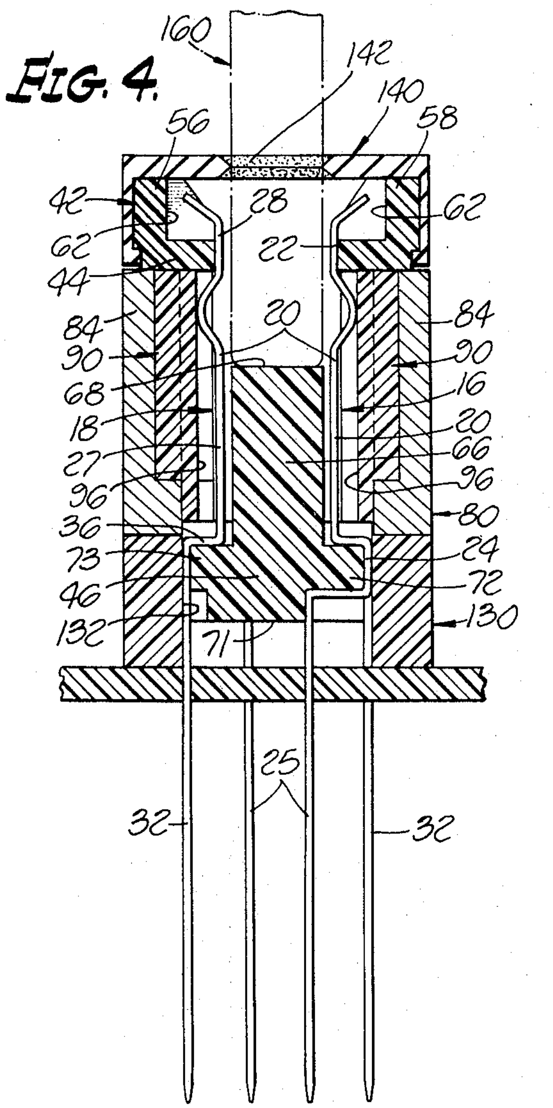
FIG. 4 shows a cross-sectional view of the printed circuit board connector in the position of FIG. 2.
Figure 5:
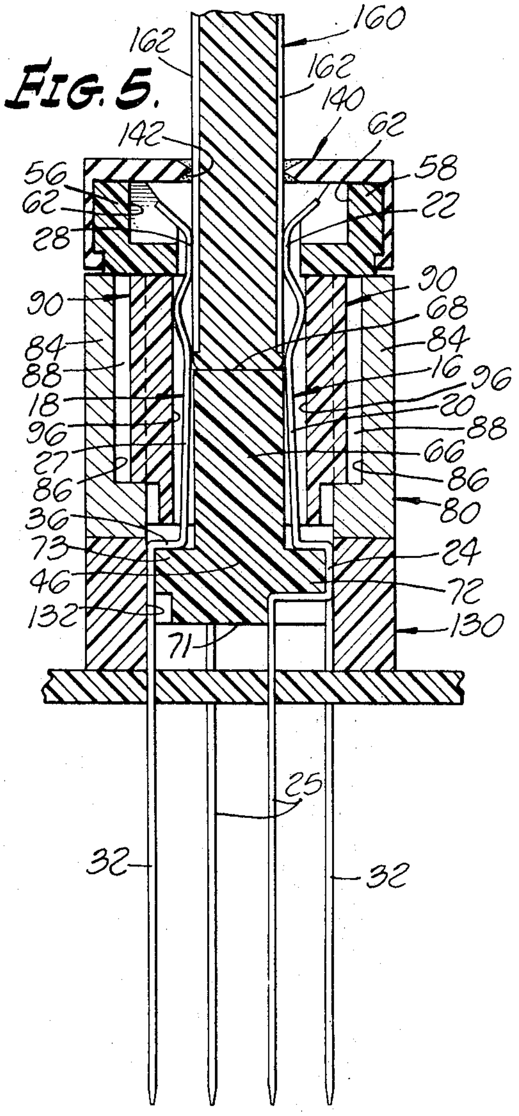
FIG. 5 depicts a cross-sectional view of the connector in the position shown in FIG. 3.
Figure 6:
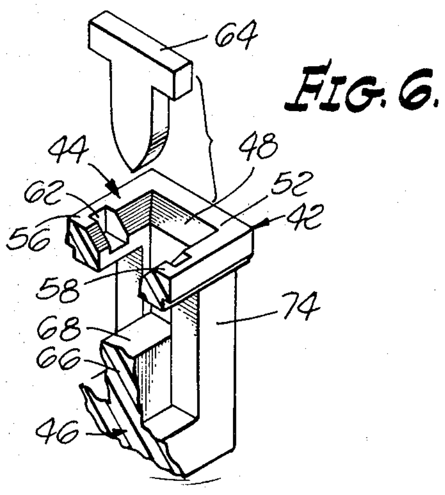
FIG. 6 illustrates a perspective view partly in section of a polarizing device incorporated in the connector.

With the foregoing in mind, referring now to FIGS. 2 and 4, the relationship of the printed circuit board and the connector are more clearly shown. As can be readily seen in FIG. 4, a printed circuit board 160 is inserted through the opening 142 in the environmental seal until it abuts the top end 68 of the contact carrier 42. The printed circuit board 160 contains a plurality of pads 162, each of which is associated with one of the contacting surfaces in the connector. The contacting surfaces 22 of contact 16 and contacting surfaces 28 of contact 18 directly oppose the pads 162. Upon rotation of the actuating cam 104 in a counterclockwise direction as shown in FIG. 2, the bearing surface 106 is moved from abutting the side wall of the actuating housing until it abuts the housing 80. The rotation of the cam causes the actuating housing 80 to move to the left as shown in FIG. 3. Referring now to FIGS. 3 and 5, there is shown the contacting surfaces 22 and 28 in contact with the pads 162 of the printed circuit board 160. Rotation of the cam from the position shown in FIG. 2 to that shown in FIG. 3 has caused the housing 80 to be displaced to the left. Movement of the housing to the left causes the ramp sections 88 of the housing to slide relative to the ramp portions 94 of the actuator spacers, forcing the actuator spacers 90 inwardly towards the printed circuit board, thus forcing the contacting surfaces 22 and 28 to abut their respective pads 162 of the printed circuit board. When the actuating cam is again rotated back to its original position, the housing returns to its original position and the contacting surfaces separate, allowing easy removal of the printed circuit board.

Figure 7:
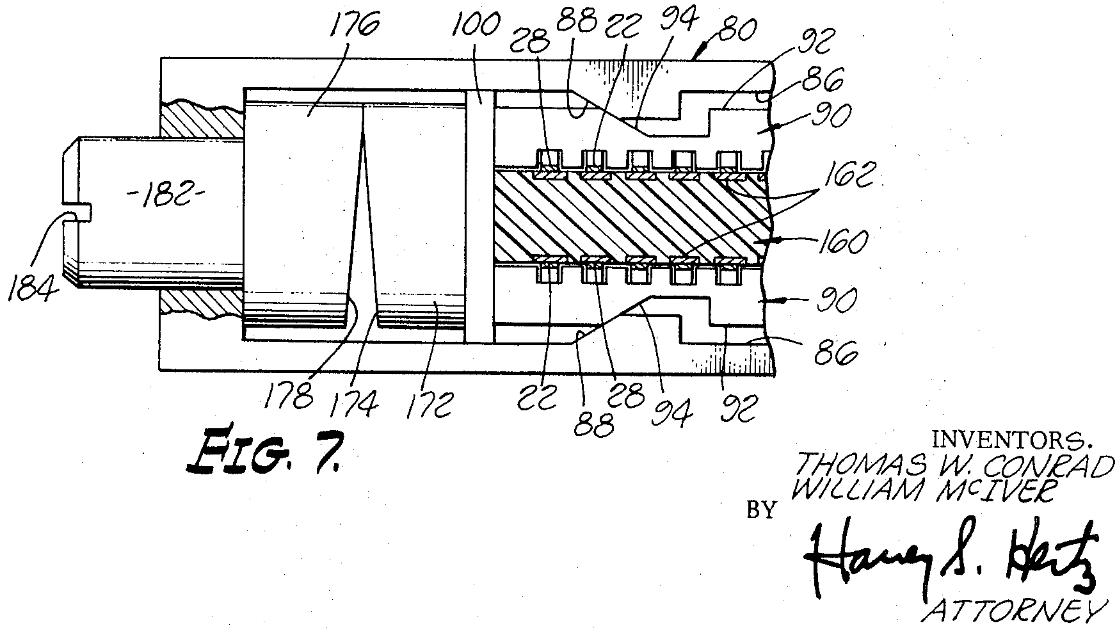
FIG. 7 is a modification of the cam actuating mechanism which may be utilized in the device of FIGS. 1–6.

Referring now to FIG. 7, there is shown an alternative embodiment for actuating the printed circuit board connector. The position of the printed circuit board and the contacting surfaces in FIG. 7 is that of being already mated together. Instead of a top actuated printed circuit board connector, the device of FIG. 7 utilizes an axial device comprising a first member 172, one end of which abuts the pressure plate 100, and the other end of which contains a slanted surface 174. A second member 176 contains a second slanted surface 178 which faces the surface 174. The other end of member 176 is connected to an actuating member 182 which protrudes through the end wall of the housing 82 and contains a slotted actuating surface 184. When the member 182 is rotated from the position shown in FIG. 7 so that the surfaces 174 and 178 abut each other, the housing member 82 moves to the right similar to that position shown in FIG. 3 and the contacting surfaces becomes disengaged.

Further, while the cam has been shown as being rotated from the top of the housing, and from the end of the housing, it should be understood, of course, that the cam means could be modified to be rotated from the side or the bottom of the housing as well.

What is claimed is:

1. A printed circuit board connector comprising:

an elongated actuating member arrangement about a longitudinal axis having an apertured top wall, an apertured bottom wall, and side walls, said side walls having an inner face and an outer face, a spacer means for co-acting with said actuating member, one side of said spacer means containing a contiguous surface to one of said side wall inner faces and the other side of which contains at least one slot indentation, a contact carrier mounted within said actuating member, at least one electrical contact mounted on said contact carrier having one end thereof secured in said slotted indentation of said spacer means, and means for moving said actuating member along its longitudinal axis, movement of said actuating member causing said spacer means and said contact to move perpendicular to said longitudinal axis.

2. A printed circuit board connector in accordance with claim 1 wherein said contact carrier contains slots for insertion of key members to form a polarizing key for correcting mating with a printed circuit board.

3. A printed circuit board connector in accordance with claim 1 wherein said actuating member side wall inner face contains a slotted portion and a ramp portion adjacent thereto, said spacer means contiguous surface having an outwardly extending section and a ramp section juxtaposed with said actuating member slotted portion and ramp portion, respectively.

4. A printed circuit board connector in accordance with claim 3, wherein said actuating member contains spacer means associated with each of its sidewalls.

5. A printed circuit board connector member in accordance with claim 2, wherein said actuating member side wall contains a plurality of slotted portions and ramp portions, and said spacer means contains a plurality of juxtaposed slotted sections and ramp sections, respectively, and wherein said spacer means contains a plurality of slotted indentations for mounting a plurality of electrical contacts therein.

6. A printed circuit board connector in accordance with claim 5, wherein said contacts are spaced on said contact carrier so that said contacts are laterally offset from adjacent contacts at the other end of said contacts.

References Cited

UNITED STATES PATENTS

| | | | |
|---|---|---|---|
| 2,935,725 | 5/1960 | Fox. | |
| 3,426,313 | 2/1969 | Mycheck ------------ | 339—74 |
| 3,475,717 | 10/1969 | Lane. | |

MARVIN A. CHAMPION, Primary Examiner

J. H. McGLYNN, Assistant Examiner

U.S. Cl. X.R.

339—176, 184